(12) United States Patent
Steiner et al.

(10) Patent No.: US 11,923,025 B2
(45) Date of Patent: Mar. 5, 2024

(54) GENERATION OF PROGRAMMING PARAMETERS FOR NON-VOLATILE MEMORY DEVICE BASED ON PHYSICAL DEVICE PARAMETERS

(71) Applicant: Kioxia Corporation, Tokyo (JP)

(72) Inventors: Avi Steiner, Kiriat Motzkin (IL); Hanan Weingarten, Herzliya (IL); Yasuhiko Kurosawa, Tokyo (JP); Neil Buxton, Reading (GB)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/131,509

(22) Filed: Dec. 22, 2020

(65) Prior Publication Data

US 2022/0199183 A1     Jun. 23, 2022

(51) Int. Cl.
| | |
|---|---|
| *G11C 29/42* | (2006.01) |
| *G11C 16/10* | (2006.01) |
| *G11C 16/26* | (2006.01) |
| *G11C 29/44* | (2006.01) |

(52) U.S. Cl.
CPC .............. *G11C 29/42* (2013.01); *G11C 16/10* (2013.01); *G11C 16/26* (2013.01); *G11C 29/44* (2013.01)

(58) Field of Classification Search
CPC ..................................................... G11C 16/10
See application file for complete search history.

(56) References Cited

U.S. PATENT DOCUMENTS

| | | | | |
|---|---|---|---|---|
| 5,506,810 A | * | 4/1996 | Runas | G11C 7/00 365/230.03 |
| 8,638,604 B1 | * | 1/2014 | Cheng | G11C 16/3454 365/185.03 |
| 8,891,303 B1 | | 11/2014 | Higgins et al. | |
| 8,995,197 B1 | * | 3/2015 | Steiner | G11C 29/021 365/185.19 |
| 9,564,233 B1 | * | 2/2017 | Cho | G11C 16/08 |
| 10,643,730 B1 | * | 5/2020 | Steiner | G11C 29/028 |
| 2009/0122949 A1 | * | 5/2009 | Reid | G11C 16/349 377/15 |
| 2013/0339586 A1 | * | 12/2013 | Weingarten | G11C 16/10 711/103 |
| 2015/0029804 A1 | * | 1/2015 | Xia | G11C 11/4091 365/222 |
| 2015/0085574 A1 | * | 3/2015 | Raghu | G11C 16/0483 365/185.11 |
| 2015/0270852 A1 | * | 9/2015 | Kim | G06F 11/1048 714/764 |
| 2015/0325298 A1 | * | 11/2015 | D'Abreu | G11C 29/70 365/185.12 |
| 2016/0118131 A1 | * | 4/2016 | Dong | G11C 7/04 365/185.02 |

(Continued)

FOREIGN PATENT DOCUMENTS

TW     I707362 B     10/2020

*Primary Examiner* — Douglas King
(74) *Attorney, Agent, or Firm* — Foley & Lardner LLP

(57) ABSTRACT

Various implementations described herein relate to systems and methods for programming data, including determining a target row corresponding to a program command and setting row-based programming parameters for the target row using target physical device parameters of the target row and optimized programming parameters corresponding to the physical device parameters.

20 Claims, 6 Drawing Sheets

(56) References Cited

U.S. PATENT DOCUMENTS

| | | | |
|---|---|---|---|
| 2016/0124641 A1* | 5/2016 | Kim .................... | G06F 3/0619 |
| | | | 711/156 |
| 2016/0147582 A1* | 5/2016 | Karakulak ........... | G06F 11/073 |
| | | | 714/37 |
| 2020/0058359 A1* | 2/2020 | Lee .................... | G11C 16/3495 |
| 2020/0133510 A1* | 4/2020 | Koudele .............. | G06F 3/0653 |
| 2020/0183771 A1* | 6/2020 | Liikanen .............. | G06F 11/073 |
| 2021/0134377 A1* | 5/2021 | Papandreou .......... | G11C 29/52 |

* cited by examiner

GENERATION OF PROGRAMMING PARAMETERS FOR NON-VOLATILE MEMORY DEVICE BASED ON PHYSICAL DEVICE PARAMETERS

TECHNICAL FIELD

The present disclosure relates generally to systems and methods for generating programming parameters used to program data on a non-volatile memory device.

BACKGROUND

Program Digital Signal Processing (DSP) is a process by which a controller (e.g., firmware implemented thereon) controls NAND programming parameters used to program data on NAND flash memory devices. In one example, traditional program DSP can be used to obtain high reliability (at the cost of write performance), for example, by modifying NAND parameters to reduce Bit-Error Rate (BER) following programming, by using more accurate programming e.g., by using smaller voltage steps such as but not limited to, Incremental Step Pulse Programming (ISPP), and so on. Such improvements in reliability is obtained at the cost of programing speed and write performance. Program DSP is typically implemented on the controller due to being used for high cycle counts.

SUMMARY

In some arrangements, a method for programming data on a storage device having a non-volatile memory includes determining a target row corresponding to a program command and setting row-based programming parameters for the target row using target physical device parameters of the target row and optimized programming parameters corresponding to the physical device parameters.

In some arrangements, a training method for determining row-based or WL-based optimized programming parameters include determining at least one result parameter for each row of a plurality of rows of blocks of a plurality of NAND flash memory devices based on the plurality of blocks of the plurality of NAND flash memory devices being programmed using programming parameters, and modifying the programming parameters for one or more rows of the plurality of rows based on the at least one result parameter

DETAILED DESCRIPTION

The arrangements disclosed herein relate to systems, methods, and non-transitory computer-readable media for providing improved endurance, average write performance, reliability (on all stress conditions), and device lifespan for non-volatile memory devices (e.g., NAND flash devices) by allowing controllers of the non-volatile memory devices to control programming flow of the non-volatile memory storage (e.g., NAND flash memory devices). In some arrangements, adaptation of specific trim parameters as function of a target memory row or wordline (WL) is applied, where such adaptation is based on training on multiple non-volatile memory devices. In some arrangements, a program DSP algorithm is implemented on a controller (e.g., a NAND memory controller) hardware and/or firmware. In some arrangements, the program DSP algorithm is implemented on host software. The program DSP algorithm lends itself to low-complexity processing.

Figure 1:
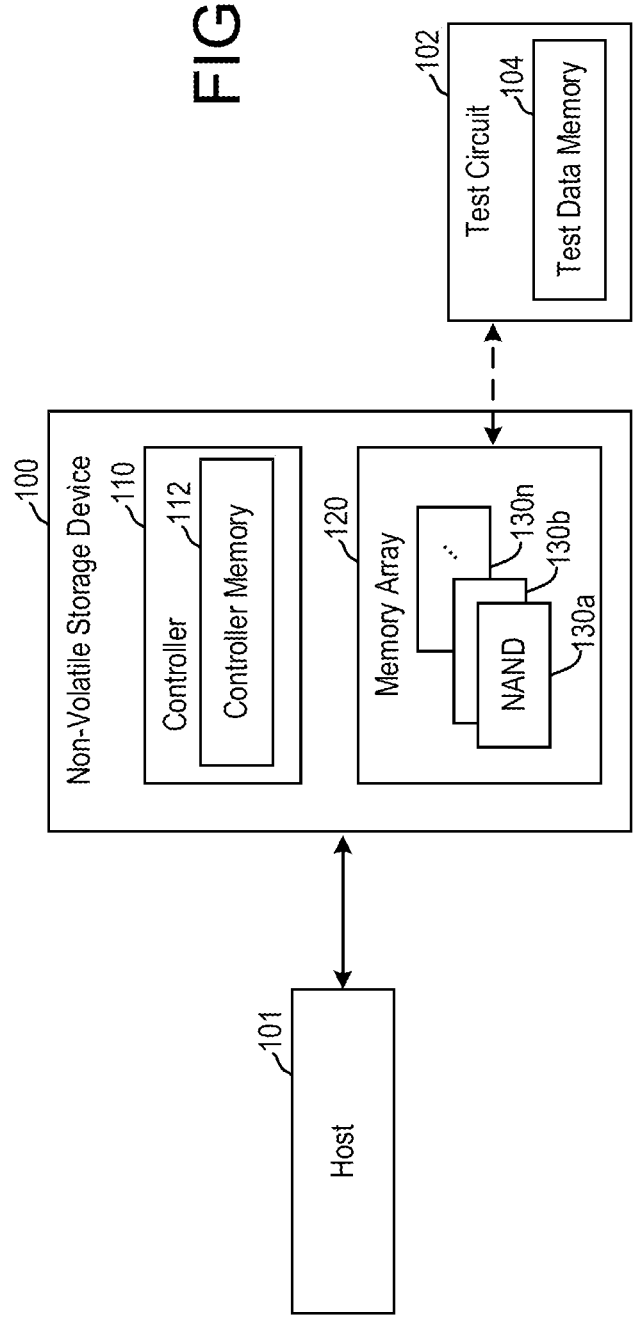
FIG. 1 shows a block diagram of a system including a non-volatile storage device coupled to a host according to some implementations.

To assist in illustrating the present implementations, FIG. 1 shows a block diagram of a system including a non-volatile storage device 100 coupled to a host 101 according to some implementations. In some examples, the host 101 can be a user device operated by a user. The host 101 may include an Operating System (OS), which is configured to provision a filesystem and applications which use the filesystem. The filesystem communicates with the non-volatile storage device 100 (e.g., a controller 110 of the non-volatile storage device 100) over a suitable wired or wireless communication link or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 100 include but are not limited to, a solid state drive (SSD), a non-volatile dual in-line memory module (NVDIMM), a Universal Flash Storage (UFS), a Secure Digital (SD) device, and so on. In other examples, the non-volatile storage device 100 can be operatively coupled to the host 101 in contexts other than datacenters.

The non-volatile storage device 100 includes at least a controller 110 and a memory array 120. Other components of the non-volatile storage device 100 are not shown for brevity. The memory array 120 includes NAND flash memory devices 130a-130n. Each of the NAND flash memory devices 130a-130n includes one or more individual NAND flash dies, which are Non-Volatile Memory (NVM) capable of retaining data without power. Thus, the NAND flash memory devices 130a-130n refer to multiple NAND flash memory devices or dies within the flash memory device 100. Each of the NAND flash memory devices 130a-130n includes one or more dies, each of which has one or more planes. Each plane has multiple blocks, and each block has multiple pages.

In some arrangements, each of the NAND flash memory devices 130a-130n is a three-dimensional NAND flash memory device which includes one or more blocks each having multiple layers. Each layer includes multiple physical rows. Applicant recognizes that there are correlations and similarities of behaviors of among rows on a same layer. Behaviors between rows of different layers of a three-dimensional NAND flash memory device vary more significantly than rows of a same layer of the three-dimensional NAND flash memory device.

As used herein, a WL is a set of physical rows belonging to a same physical layer of a three-dimensional NAND flash memory device, which has multiple physical layers, in some examples. The rows of a WL can be adjacent to one another. In some examples, WL is used to refer to a set of rows of a NAND flash memory device, where the rows may not be adjacent to one another and/or may not be in a same physical layer. Programming parameters being optimized per WL means that all rows which belong to a given WL will use same parameters.

While the NAND flash memory devices 130a-130n are shown to be examples of the memory array 120, other examples of non-volatile memory technologies for implementing the memory array 120 include but are not limited to, (battery-backed) Dynamic Random Access Memory (DRAM), Magnetic Random Access Memory (MRAM), Phase Change Memory (PCM), Ferro-Electric RAM (Fe-RAM), and so on. The ECC structure described herein can be likewise implemented on memory systems using such memory technologies and other suitable memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function logically as a single unit of storage. The controller 110 can include processors, microcontrollers, buffers, error correction systems, data encryption systems, Flash Translation Layer (FTL) and flash interface modules. Such functions can be implemented in hardware, software, and firmware or any combination thereof. In some arrangements, the software/firmware of the controller 110 can be stored in the memory array 120 or in any other suitable computer readable storage medium.

The controller 110 includes suitable processing and memory capabilities for executing functions described herein, among other functions. As described, the controller 110 manages various features for the NAND flash memory devices 130a-130n including but not limited to, I/O handling, reading, writing/programming, erasing, monitoring, logging, error handling, garbage collection, wear leveling, logical to physical address mapping, data protection (encryption/decryption, Cyclic Redundancy Check (CRC)), Error Correction Coding (ECC), data scrambling, and the like. Thus, the controller 110 provides visibility to the NAND flash memory devices 130a-130n.

The controller 110 further includes a controller memory 112. The controller memory 112 is a memory device local to or operatively coupled to the controller 110. For instance, the controller memory 112 can be an on-chip non-volatile memory or volatile memory located on the chip of the controller 110. In some implementations, the controller memory 112 can be implemented using a memory device external to the controller 110. For instance, the controller memory 112 can be non-volatile memory or volatile memory located on a chip other than the chip of the controller 110. In some implementations, the controller memory 112 can be implemented using memory devices both internal and external to the controller 110 (e.g., both on and off the chip of the controller 110).

In some arrangements, after the NAND flash memory devices 130a-130n have been manufactured and before the NAND flash memory devices 130a-130n are installed within the non-volatile storage device 100 (e.g., before the NAND flash memory devices 130a-130n are connected to other components of the non-volatile storage device 100 such as the controller 110), the NAND flash memory devices 130a-130n can be operatively coupled to a test circuit 102, which is configured to perform the training for program DSP parameters as disclosed herein. Performing the training using a third-party test circuit 102, before the non-volatile storage device 100 (with the memory array 120) is powered on for the first time is referred to as offline-training. The training methods described herein are performed with respect to a small number blocks of the NAND flash memory devices 130a-130n, such that running P/E cycles on those blocks would not noticeably diminish life-time of all blocks of the NAND flash memory devices 130a-130n. In other examples, such training is performed with respect to sacrificial NAND flash memory devices that are representative of the NAND flash memory devices 130a-130n, such as NAND flash memory devices being cut from same wafer as that of the NAND flash memory devices 130a-130n. In such examples, the table determined using the sacrificial NAND flash memory devices is likewise applied to the NAND flash memory devices 130a-130n due to similar behaviors. Given that the P/E cycles are run on devices other than the NAND flash memory devices 130a-130n that are included in the non-volatile storage device 100. Accordingly, performing offline training allow optimization of the memory array 120 before the non-volatile storage device 100 is powered on for use, thus conserving power-on time and life-time of the NAND flash memory devices 130a-130n.

The test circuit 102 can include suitable processing capabilities (e.g., processors, memory, and so on) for performing the functions described herein. In addition, the test circuit 102 includes a test data memory 104 configured to store data generated during the training methods described herein as well as an output of the training methods (e.g., a table of programming parameters mapped to physical device parameters, such as but not limited to a row address, a block address, a cycle count, and so on). The test circuit 102 can transfer the table to the controller memory 112 using any suitable mechanism.

In other arrangements, the training methods described herein can be performed by the test circuit 102 or the controller 110 online, during or after the first power on of the non-volatile storage device 100. In the example in which the training methods is performed by the controller 110, the data generated during the training methods and the table of programming parameters mapped to physical device parameters can be stored in the controller memory 112 directly.

In some examples, in a three BPC non-volatile storage device (e.g., a flash memory device, a NAND device, and so on), the threshold voltage distribution includes a superposition of eight (e.g., 0-7) possible voltage threshold distributions of a three BPC flash memory device or a NAND device, also referred to as Three Level Cells (TLC). The possible Voltage Threshold (VT) distributions of a cell have eight lobes, corresponding to 8 different bit combinations of the three bits represented by the charge state of the cell. A Most Significant Bit (MSB) page read uses first reference voltages (or read thresholds) to separate the lobes into those with MSBs of 0 and those with MSBs of 1. A Center Significant Bit (CSB) page read uses second reference voltages. A Leas Significant Bit (LSB) page read uses third reference voltages.

In some examples, programming of four BPC in Quad Level Cell (QLC) uses 16 charge levels to store information per cell. QLC uses programming circuits more accurate than those for TLC. In that regard, QLC devices, which have more accurate programing circuit, have programming time longer than that of TLC devices or Single Level Cells (SLC) devices. Programming time is denoted by tProg and represents the time a NAND device is busy due its internal programming circuits being activated to program new data. An average tProg measured on multiple blocks and rows determine the write performance of the NAND devices. The arrangements disclosed herein provides program DSP solutions to improve the program performance of QLC (e.g., by improving QLC tProg) without reducing the attainable reliability.

Program DSP is a process by which the controller 110 (e.g., firmware implemented thereon) controls NAND programming parameters. In one example, traditional program DSP can be used to obtain high reliability (at the cost of write performance), for example, by modifying NAND parameters to reduce Bit-Error Rate (BER) following programming, by using more accurate programming e.g., by using smaller voltage steps such as but not limited to, Incremental Step Pulse Programming (ISPP), and so on. Such improvements in reliability is obtained at the cost of programing speed and write performance. Program DSP is typically implemented on the controller 110 due to being used for high cycle counts.

In another example, traditional program DSP can be used to obtain high write performance (high speed programming) by tuning NAND parameters for each of the NAND flash memory devices 130a-130n separately. The controller 110 can set NAND parameters for each of the NAND flash memory devices 130a-130n during programming. Such program DSP includes a training process for each of the NAND flash memory devices 130a-130n at a start of life (before the device is first used) and/or on cycled block(s). Such training process is an overhead during production, and in some cases, impacts the initial power-up performance of a new NAND flash memory device.

In one traditional program DSP, the controller 110 estimates new parameters for a NAND flash memory device every cycle range. Each cycle range can include, for example, 200 Program/Erase (P/E) cycles. On every cycle range, a test block is used to examine different candidates of programming parameters. The parameters are computed using a program time improvement estimator, and are evaluated by measuring the BER following the programming. The BER is measured by performing a read of the data previously programmed, meaning a process of programming and read is needed for evaluating the parameters. Given that such processes are performed for every NAND flash memory device, the controller 110 is best suited to perform these processes. In addition, the criteria for accepting new parameters are based on tProg measured and the maximal page BER value. Such criteria limits the robustness of the program DSP.

The arrangements described herein relate to performing training for program DSP parameters on a sufficiently large group of the NAND flash memory devices 130a-130n to determine a most suitable common set of programming parameters, which can vary as function of physical device parameters of the NAND flash memory devices 130a-130n. Examples of physical device parameters include device but are not limited to, a row number, a block number, a cycle count, and so on. In some implementations, an output of the training includes a table of programming parameters mapped to physical device parameters for all NAND flash memory devices 130a-130n of the memory array 120. Using the table, the controller 110 can determine a value of a program parameter using physical device parameters. The table is stored in the controller memory 112 in some examples. Accordingly, the controller 110 can use the table to set programming parameters for all NAND flash memory devices 130a-130n managed by the controller 110, without having to tune any of programming parameters for each of the NAND flash memory devices 130a-130n beyond determining those programming parameters as a function of common physical device parameters.

In some implementations, the training for program DSP can be performed on a sufficiently large number of the NAND flash memory devices 130a-130n to determine the most suitable common set of programming parameters, which vary as function of the physical device parameters of the NAND flash memory devices 130a-130n. This allows the controller 110 to set adequate programming parameters without the tuning overhead for each of the NAND flash memory devices 130a-130n attached to the controller 110.

Figure 2:
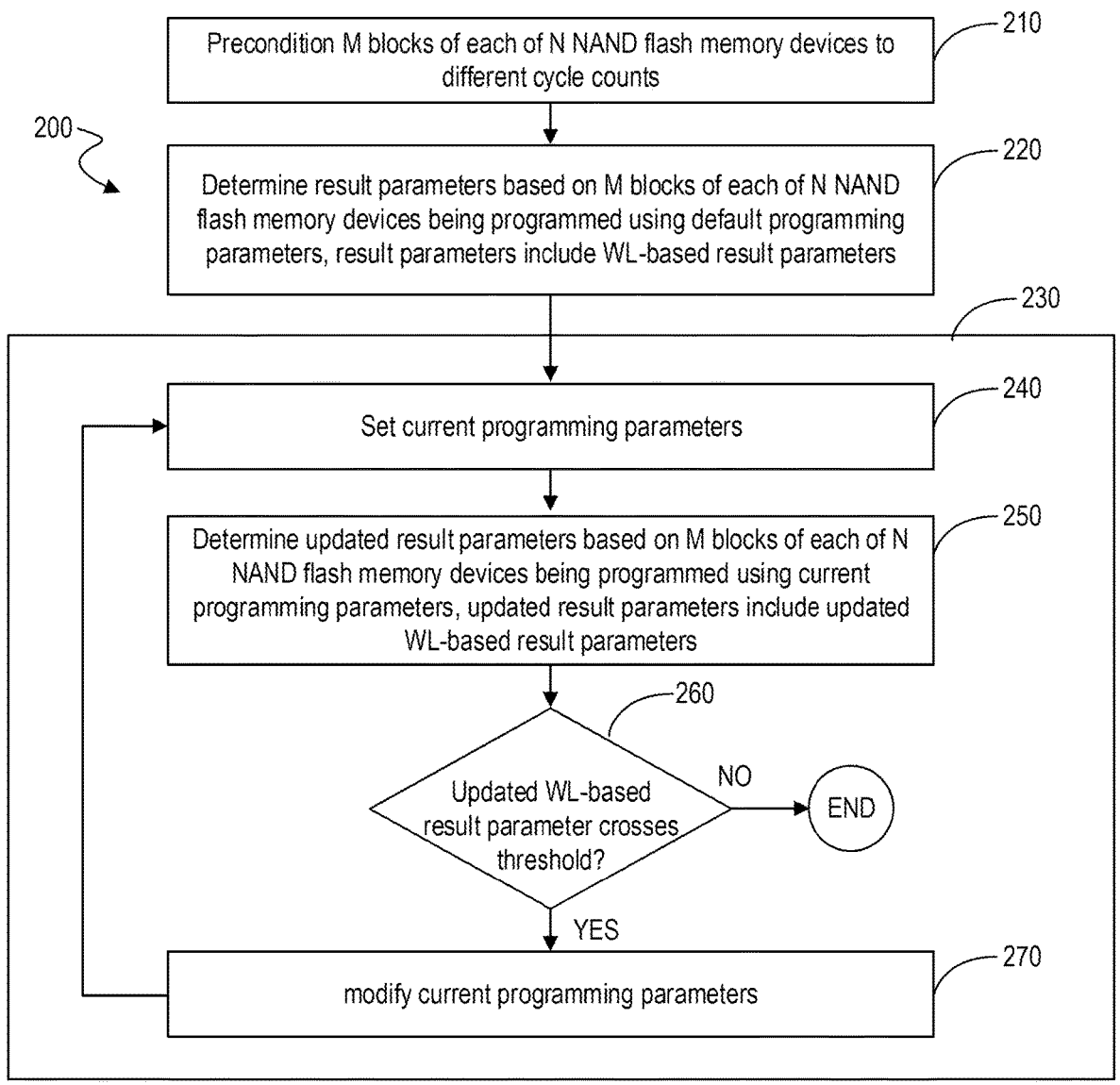
FIG. 2 is a flowchart illustrating an example training method, according to some arrangements.

FIG. 2 is a flow chart illustrating an example training method 200, according to some arrangements. Referring to FIGS. 1-2, the training method 200 allows the test circuit 102 to generate a parameter table. The training method 200 can be an offline training method or an online training method. While the test circuit 102 is described to be performing the training method 200 (online or offline), the controller 110 can also perform the training method 200 (online). The parameter table maps the correspondence between programming parameters and physical device parameters such as but not limited to, rows (defined by row address/ID/number), WL (defined by WL address/ID/number or a range of row addresses/IDs/numbers), or so on. In general, the method 200 optimizes write performance of N NAND flash memory devices to a target average programming time (tProg$_{DSP}$). In some examples in which a higher write performance is expected, tProg$_{DSP}$ is shorter than a default tProg. The N NAND flash memory devices can be all of the NAND flash memory devices 130a-130n, some but not all of the NAND flash memory devices 130a-130n, or sacrificial NAND flash memory devices having behavior similar to the NAND flash memory devices 130a-130n. In the examples in which the N NAND flash memory devices correspond to some but not all of the NAND flash memory devices 130a-130n or the sacrificial NAND flash memory devices, the N NAND flash memory devices constitute a sufficiently large group of the NAND flash memory devices based on which a most suitable common set of programming parameters can be determined, where such programming parameters can be applied to all of the NAND flash memory devices 130a-130n.

At 210, the test circuit 102 preconditions M blocks of each of N NAND flash memory devices to different cycle counts. In some examples, M is less than the total number of blocks of each NAND flash memory device. Each of the M blocks is identified by a block address. The M blocks (can also be referred to as M test blocks) can be selected at random within the set of all blocks of each NAND flash memory device in some examples. In other examples, the M blocks can be selected according to other suitable methods (e.g., those described in FIG. 4). Accordingly, each of the N NAND flash memory devices can have different M blocks (a different M-block address list including addresses of the M blocks) used in write performance optimization. All of the M blocks are within a common block set.

The different cycle counts can be determined based on a maximum number of P/E cycles (maximum cycle count) that a NAND flash memory device can endure before the NAND flash memory device cannot be written or programmed with any new data. Writing data on a block (by writing on pages thereon) and erasing the data on the block constitute one P/E cycle. The maximum cycle count can depend on the specification (specified device endurance), and may be different for different applications of the non-volatile storage device 100. In some implementations, the number of the different cycle counts is also M.

In one example application in which the non-volatile storage device 100 is an SSD, the maximal cycle count supported by the NAND flash memory devices is 10,000 P/E cycles. In this application, for instance, a sample set of 50 blocks (M=50) can be preconditioned for each NAND flash memory device to different cycles counts 200, 400, 600, . . . , 10,000 P/E cycles, to obtain a representative set of program disturb stress conditions. The program disturb stress conditions are achieved via the different cycle counts, where high program disturb corresponds to a large number of P/E cycles. The cycle counts are applied increasing in a "rising staircase" fashion, in order to determine the point of maximal cycle count of the specific devices used in the specific application In one example application in which the non-volatile storage device 100 is a UFS, the maximal cycle count supported by the NAND flash memory devices is 3,000 P/E cycles. In this application, for instance, 50 blocks (M=50) can be preconditioned for each NAND flash memory device to different cycles counts 60, 120, 180, . . . , 3,000 P/E cycles, to obtain a representative set of program disturb stress conditions.

Preconditioning the M blocks of each of the N NAND flash memory devices refers to cycling each of the M blocks to one of the different cycle counts.

At 220, the test circuit 102 determines result parameters for M blocks of the N NAND flash memory devices based on default programming parameters, where the result parameters include WL-based result parameters. For example, the controller 110 programs all rows and WLs of all M blocks of all of the N NAND flash memory devices with random reference data using the default programming parameters. Examples of the default programming parameters include but are not limited to, a default initial voltage level of a programmed cell $V_{start}$, default pulse voltage step $V_{step}$, default bias voltage $V_{bias}$, a default maximum Number of Pulses (NPP), and other default parameters used in the ISPP, and so on. Then, the random reference data is read using default voltage thresholds.

Typically, a programming operation includes a process of multiple small charge injection steps. A charge may be injected to a memory cell by applying a voltage pulse $V_{pulse}$, starting at $V_{start}$, to a row being programmed and setting the gate voltages of all other transistors in the string to $V_{bias}$. After applying the $V_{pulse}$, the programmed cell is read and compared to a desired programming voltage. In response to determining that the desired programming voltage is reached, the programming ends. On the other hand, in response to determining that the desired programming voltage is not reached, additional pulses are provided until reaching the desired programming voltage or until reaching NPP. In the case in which after NPP has been used and there remain cells that did not pass the verify test (e.g., those cells were not programmed to the desired programming voltage), a program error (or failure) can be declared. ISPP includes increasing the level of $V_{pulse}$ by a $V_{step}$ for each increment.

Based on the programming and reading, the result parameters are measured and stored. For example, the test circuit 102 determines and stores in the test data memory 104 an average tProg across all M blocks of all N NAND flash memory devices and an average page BER across all M blocks of all N NAND flash memory devices.

In addition, the test circuit 102 determines and stores in the controller memory 112 a standard deviation (STD) of the page BER for each WL with respect to the average page BER across all M blocks and N NAND flash memory devices, where such STD is referred to as STD(WL). In other words, STD(WL) refers to the standard deviation of the page BER as a function of WL, measured against the average page BER across all M blocks and N NAND flash memory devices. For example, the test circuit 102 can measure the page BER for each WL, and compute the STD of the page BER as function of an individual row or a WL (multiple rows) and with respect to the average (mean) page BER across all M blocks of all N NAND flash memory devices, to determine STD(WL).

Further, the test circuit 102 determines and stores in the controller memory 112 a maximum BER for each WL of all M blocks of all N NAND flash memory devices, referred to as $BER_{MAX}(WL)$ and an average BER for each WL all M blocks of all N NAND flash memory devices, referred to as $BER_{AVG}(WL)$.

Accordingly, the result parameters include but are not limited to, the average tProg, the average page BER, STD (WL), $BER_{MAX}(WL)$, and $BER_{AVG}(WL)$. The WL-based result parameters include STD(WL), $BER_{MAX}(WL)$, and $BER_{AVG}(WL)$ for each WL.

In some arrangements, the test circuit 102 determines and stores in the controller memory 112 higher order moments of the page BER distribution as function of physical device parameters (e.g., row, WL, and so on) of the NAND flash memory devices. For example, an n-th order moment $\mu_n$ of a random variable x is defined as:

$$\mu_n(x)=E[(x-E[x])^n] \quad (1);$$

where E[x] is an expectation of random variable x. The random variable STD(WL) with a moment of 2 can be determined using:

$$STD(WL)=\sqrt{\mu_2(WL)} \quad (2).$$

WL refers to BER distribution as function of WL. Higher moments such as $\mu_3(WL)$ in expression (3) below, and $\mu_4(WL)$ in expression (4) below can also be used to determine STD(WL):

$$STD(WL)=\sqrt{\mu_3(WL)} \quad (3); \text{ and}$$

$$STD(WL)=\sqrt{\mu_4(WL)} \quad (4).$$

The initial characteristic conditions corresponding to 220 is a baseline of default conditions that serve as a starting point of the optimization process to the target average programming time ($tProg_{DSP}$).

At 230, the test circuit 102 modifies the default programming parameters such that the average tProg becomes (becomes closer to) $tProg_{DSP}$ and set a STD threshold target ($STD_{TH}$). As shown, 230 includes blocks 240-270 executed iteratively.

At 240, current programming parameters are set. The previous programming parameters (the current programming parameters in the previous iteration) are modified to become the current programming parameters.

At 250, the test circuit 102 determines result parameters for M blocks of the N NAND flash memory devices on the current programming parameters, where the result parameters include updated WL-based result parameters. For example, the controller 110 programs all rows and WLs of all M blocks of all of the N NAND flash memory devices with random reference data using the current programming parameters. Examples of the current programming parameters include but are not limited to, $V_{start}$, $V_{step}$, $V_{bias}$, NPP, and other parameters used in the ISPP or other program trim parameters, and so on. Then, the random reference data is read using default voltage thresholds. Based on the programming and reading, the updated result parameters are measured by the test circuit 102 and stored in the controller memory 112. Such updated result parameters include but are not limited to, the average tProg, the average page BER, STD(WL), $BER_{MAX}$(WL), and $BER_{AVG}$(WL). The updated WL-based result parameters include STD(WL), $BER_{MAX}$(WL), and $BER_{AVG}$(WL) for each WL.

At 260, the test circuit 102 determines whether one or more of the updated WL-based result parameters crosses a threshold.

In some examples, the test circuit 102 determines whether STD(WL) for any WL of all M blocks of all N NAND flash memory devices is greater a predetermined threshold $STD_{TH}$:

$$STD(WL) > STD_{TH} \quad (5).$$

In response to determining that STD(WL) for at least one WL of all M blocks of all N NAND flash memory devices is greater than $STD_{TH}$ (260:YES), the method 200 proceeds to 270. On the other hand, in response to determining that there is no WL having a STD(WL) that is greater than $STD_{TH}$ (260:NO), the process 200 ends given that the current programing parameters are already optimized.

In some examples, the test circuit 102 determines whether $BER_{MAX}$(WL) for any WL of all M blocks of all N NAND flash memory devices is greater than a predetermined threshold $MAX_{TH}$:

$$BER_{MAX}(WL) > MAX_{TH} \quad (6).$$

In response to determining that $BER_{MAX}$(WL) for at least one WL of all M blocks of all N NAND flash memory devices is greater than $MAX_{TH}$ (260:YES), the method 200 proceeds to 270. On the other hand, in response to determining that there is no WL having a $BER_{MAX}$(WL) that is greater than $MAX_{TH}$ (260:NO), the process 200 ends given that the current programing parameters are already optimized.

In some examples, the test circuit 102 determines whether $BER_{AVG}$(WL) for any WL of all M blocks of all N NAND flash memory devices is greater than a predetermined threshold $AVG_{TH}$:

$$BER_{AVG}(WL) > AVG_{TH} \quad (7).$$

In response to determining that $BER_{AVG}$(WL) for at least one WL of all M blocks of all N NAND flash memory devices is greater than $AVG_{TH}$ (260:YES), the method 200 proceeds to 270. On the other hand, in response to determining that there is no WL having a $BER_{AVG}$(WL) that is greater than $AVG_{TH}$ (260:NO), the process 200 ends given that the current programing parameters are already optimized.

In some examples, one of STD(WL), $BER_{MAX}$(WL), or $BER_{AVG}$(WL) is used as the WL-based result parameter for evaluation at 260. In other examples, two or more of the STD(WL), $BER_{MAX}$(WL), and $BER_{AVG}$(WL) are used as the WL-based result parameter for evaluation at 260.

At 270, the test circuit 102 modifies the current programming parameters. The modified current programming parameters in the current iteration are set as the current programming parameters in a next iteration, e.g., at 240.

In the example in which STD(WL) is used as the updated WL-based result parameter at 260, the test circuit 102 can modify the current programming parameters to: increase tProg on each WL having STD(WL) greater than $STD_{TH}$ (e.g., by decreasing $V_{start}$ or changing other program DSP trim parameters); and decrease tProg on each WL having STD(WL) less than or equal to $STD_{TH}$ (e.g., by increasing $V_{start}$ or changing other program DSP trim parameters). In some implementations, trim parameters can be accessed using NAND internal configurable registers which control the program/read logic. In some implementations, these registers are set using specific feature set commands issued to the controller 110. For example, in a programming process which includes generating pulses at a gradually increasing voltage levels, the voltage level of the first pulse is referred to as $V_{start}$, and the increment step for next pulse is referred to as $V_{step}$. Increasing the value of the $V_{start}$ parameter causes more cells to respond to the first pulse and the programming process may succeed more quickly, but at the expense of program accuracy (as evaluated by the BER in memory reads made following programming). Similarly, increasing/decreasing the value of the $V_{step}$ parameter makes the program accuracy more coarse/fine, while making the programming process to proceed more quickly/slowly. Examples of other DSP trim parameters include, but are not limited to, the programming voltage pulse width, pulse shape, pulse rise time, pulse fall time, and inter-pulse delay time. Decreasing $V_{start}$ allows for higher accuracy programming, which in-turn reduces the STD(WL). On the other hand, increasing $V_{start}$ allows for lower accuracy programming, which in-turn increases the STD(WL). Increasing tProg on some WL and decreasing tProg on other WL equalize the STD(WL) of the WLs while maintaining same average $tProg_{DSP}$ across the M programmed blocks.

In the example in which $BER_{MAX}$(WL) is used as the updated WL-based result parameter at 260, the test circuit 102 can modify the current programming parameters to: increase tProg on each WL having $BER_{MAX}$(WL) greater than $MAX_{TH}$ (e.g., by decreasing $V_{start}$ or changing other program DSP trim parameters); and decrease tProg on each WL having $BER_{MAX}$(WL) less than or equal to $MAX_{TH}$ (e.g., by increasing $V_{start}$ or changing other program DSP trim parameters). Decreasing $V_{start}$ allows for higher accuracy programming, which in-turn reduces the $BER_{MAX}$(WL). On the other hand, increasing $V_{start}$ allows for lower accuracy programming, which in-turn increases the $BER_{MAX}$(WL). Increasing tProg on some WL and decreasing tProg on other WL equalize the $BER_{MAX}$(WL) of the WLs while maintaining same average $tProg_{DSP}$ across the M programmed blocks.

In the example in which $BER_{AVG}$ is used as the updated WL-based result parameter at 260, the test circuit 102 can modify the current programming parameters to: increase tProg on each WL having $BER_{AVG}$ greater than $AVG_{TH}$ (e.g., by decreasing $V_{start}$ or changing other program DSP trim parameters); and decrease tProg on each WL having $BER_{AVG}$ less than or equal to $AVG_{TH}$ (e.g., by increasing $V_{start}$ or changing other program DSP trim parameters). Decreasing $V_{start}$ allows for higher accuracy programming, which in-turn reduces the $BER_{AVG}$. On the other hand, increasing $V_{start}$ allows for lower accuracy programming, which in-turn increases the $BER_{AVG}$. Increasing tProg on some WL and decreasing tProg on other WL equalize the $BER_{AVG}$ of the WLs while maintaining same average $tProg_{DSP}$ across the M programmed blocks.

The output at the end of the method 200 (e.g., at 260:NO) is a set of current programming parameters (e.g., $V_{start}$, $V_{step}$, $V_{bias}$, NPP, and other parameters used in the ISPP or other program trim parameters) as a function of row or WL. Each row or WL has its own set of programming parameters determined using the method 200. Such output can be in the form of the parameter table as described. In some implementations, the controller 110 selects the programming parameters for a row or WL from a table of row-dependent programming parameters indexed using a row or WL number. The physical device parameters include, for each row or WL, a row or WL address/ID/number or a range of row addresses/IDs/numbers of each row or WL. The physical device parameters can further include, for each row or WL, a block address/ID/number of the block on which the row or WL is located and the cycle count to which the block on which the row or WL is located is cycled (during the precondition). The programming parameters for each row or WL are the current programming parameters during the iteration in which 260:NO is detected, where such programming parameters are mapped to the physical device parameters for each row or WL.

The method 200 allows iterative computation of row-sets (WL) using preconditioned program disturb-only blocks, and can be run in parallel on multiple NAND flash memory devices. The output of method 200 is used by the controller 120 to provide high performance programming at a $tProg_{DSP}$ target while guaranteeing the reliability due to the training algorithm verifying the BER distribution conditions.

While the method 200 is described with respect to WL, which is a set of rows, the method 200 can be likewise performed in the unit of a row, e.g., the WL includes only one row instead of multiple rows. For example, instead of WL-based result parameters being determined at 220, row-based result parameters can be determined. In that regard, the resulting set of programming parameters of the method 200 is specific to a WL (multiple rows) or specific to a single row.

Figure 3:
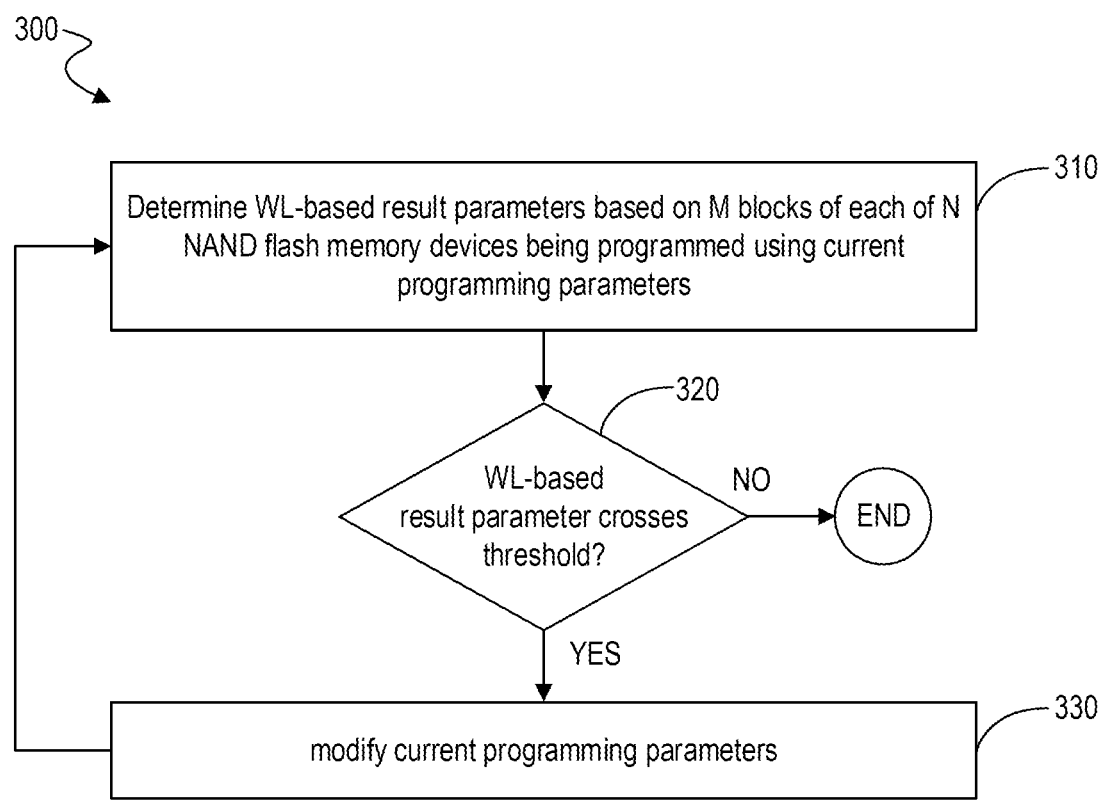
FIG. 3 is a flowchart illustrating an example training method, according to some arrangements.

FIG. 3 is a flowchart illustrating an example training method 300, according to some arrangements. Referring to FIGS. 1-3, the training method 300 allows the test circuit 102 to generate a parameter table. The training method 300 can be an offline training method or an online training method. While the test circuit 102 is described to be performing the training method 300 (online or offline), the controller 110 can also perform the training method 300 (online). In general, the method 300 optimizes write performance of N NAND flash memory devices to $tProg_{DSP}$. The N NAND flash memory devices can be all of the NAND flash memory devices 130a-130n, some but not all of the NAND flash memory devices 130a-130n, or sacrificial NAND flash memory devices having behavior similar to the NAND flash memory devices 130a-130n. In the examples in which the N NAND flash memory devices correspond to some but not all of the NAND flash memory devices 130a-130n or the sacrificial NAND flash memory devices, the N NAND flash memory devices constitute a sufficiently large group of the NAND flash memory devices based on which a most suitable common set of programming parameters can be determined, where such programming parameters can be applied to all of the NAND flash memory devices 130a-130n. The method 300 can be adapted to specific NAND distribution as described.

At 310, the test circuit 102 determines WL-based result parameters based on M blocks of each of the N NAND flash memory devices being programmed using current programming parameter. For example, the controller 110 programs all rows and WLs of all M blocks of all of the N NAND flash memory devices with random reference data using the current programming parameters. Examples of the current programming parameters include but are not limited to, $V_{start}$, $V_{step}$, $V_{bias}$, NPP, and other parameters used in the ISPP or other program trim parameters, and so on. Then, the random reference data is read using default voltage thresholds.

Based on the programming and reading, the result parameters are measured and stored. For example, the test circuit 102 determines and stores in the test data memory 104 an average tProg across all M blocks of all N NAND flash memory devices and an average page BER across all M blocks of all N NAND flash memory devices.

In addition, the test circuit 102 determines and stores in the controller memory 112 a maximum BER for each WL of all M blocks of all N NAND flash memory devices, referred to as $BER_{MAX}(WL)$.

Furthermore, the test circuit 102 determines and stores in the controller memory 112 a plurality of moments (from order 1 to K) of the BER distribution as function of WL (referred to WL), referred to as:

$$\{\mu_i(WL)\}_{i=1}^{K} \tag{8}$$

The test circuit 102 can determined an optimization score using an optimization score function incorporating the plurality of moments, such as:

$$S=\Sigma_{i=1}^{K} w_i \cdot \mu_i(WL) \tag{9},$$

where $w_i$ is the weight of the i-th order moment in the optimization score function, and S is the optimization score. Accordingly, the optimization score function is a weight sum of moments function.

Accordingly, the WL-based result parameters includes at least one of $BER_{MAX}(WL)$ or S.

At 320, the test circuit 102 determines whether one or more of the WL-based result parameters crosses a threshold.

In some examples, the test circuit 102 determines whether the optimization score S (e.g., the weight sum of moments) for any WL of all M blocks of all N NAND flash memory devices is greater than a score threshold UTH:

$$S>UTH \tag{10}.$$

In response to determining that S for at least one WL of all M blocks of all N NAND flash memory devices is greater than UTH (320:YES), the method 300 proceeds to 330. On the other hand, in response to determining that there is no WL having S that is greater than MAXIE (320:NO), the process 300 ends given that the current programing parameters are already optimized.

In some examples, the test circuit 102 determines whether $BER_{MAX}(WL)$ for any WL of all M blocks of all N NAND flash memory devices is greater than a predetermined threshold $MAX_{TH}$, for example, per expression (6). In response to determining that $BER_{MAX}(WL)$ for at least one WL of all M blocks of all N NAND flash memory devices is greater than $MAX_{TH}$(320:YES), the method 300 proceeds to 330. On the other hand, in response to determining that there is no WL having a $BER_{MAX}(WL)$ that is greater than $MAX_{TH}$(320: NO), the process 200 ends given that the current programing parameters are already optimized.

At 330, the test circuit 102 modifies the current programming parameters. The modified current programming parameters in the current iteration are set as the current programming parameters in a next iteration, e.g., for 310.

In the example in which S is used as the WL-based result parameter at 320, the test circuit 102 can modify the current programming parameters to: increase tProg on each WL having S greater than UTH (e.g., by decreasing $V_{start}$ or changing other program DSP trim parameters); and decrease tProg on each WL having S less than or equal to UTH (e.g., by increasing $V_{start}$ or changing other program DSP trim parameters). Decreasing $V_{start}$ allows for higher accuracy programming, which in-turn reduces S. On the other hand, increasing $V_{start}$ allows for lower accuracy programming, which in-turn increases S. Increasing tProg on some WL and decreasing tProg on other WL equalize the S of the WLs while maintaining same average $tProg_{DSP}$ across the M programmed blocks.

In the example in which $BER_{MAX}(WL)$ is used as the WL-based result parameter at 320, the test circuit 102 can modify the current programming parameters to: increase tProg on each WL having $BER_{MAX}(WL)$ greater than MAXI (e.g., by decreasing $V_{start}$ or changing other program DSP trim parameters); and decrease tProg on each WL having $BER_{MAX}(WL)$ less than or equal to $MAX_{TH}$ (e.g., by increasing $V_{start}$ or changing other program DSP trim parameters). As described, decreasing $V_{start}$ allows for higher accuracy programming, which in-turn reduces the $BER_{MAX}(WL)$. On the other hand, increasing $V_{start}$ allows for lower accuracy programming, which in-turn increases the $BER_{MAX}(WL)$. Increasing tProg on some WL and decreasing tProg on other WL equalize the $BER_{MAX}(WL)$ of the WLs while maintaining same average $tProg_{DSP}$ across the M programmed blocks.

The output at the end of the method 300 (e.g., at 320:NO) is a set of current programming parameters (e.g., $V_{start}$, $V_{step}$, $V_{bias}$, NPP, and other parameters used in the ISPP or other program trim parameters) as a function of WL. Each WL has its own set of programming parameters determined using the method 300. Such output can be in the form of the parameter table as described. The physical device parameters include, for each WL, a WL address/ID/number or a range of row addresses/IDs/numbers of each WL. The physical device parameters can further include, for each WL, a block address/ID/number of the block on which the WL is located. The programming parameters for each WL are the current programming parameters during the iteration in which 320:NO is detected, where such programming parameters are mapped to the WL address/ID/number or the range of row addresses/IDs/numbers of each WL.

Figure 4:
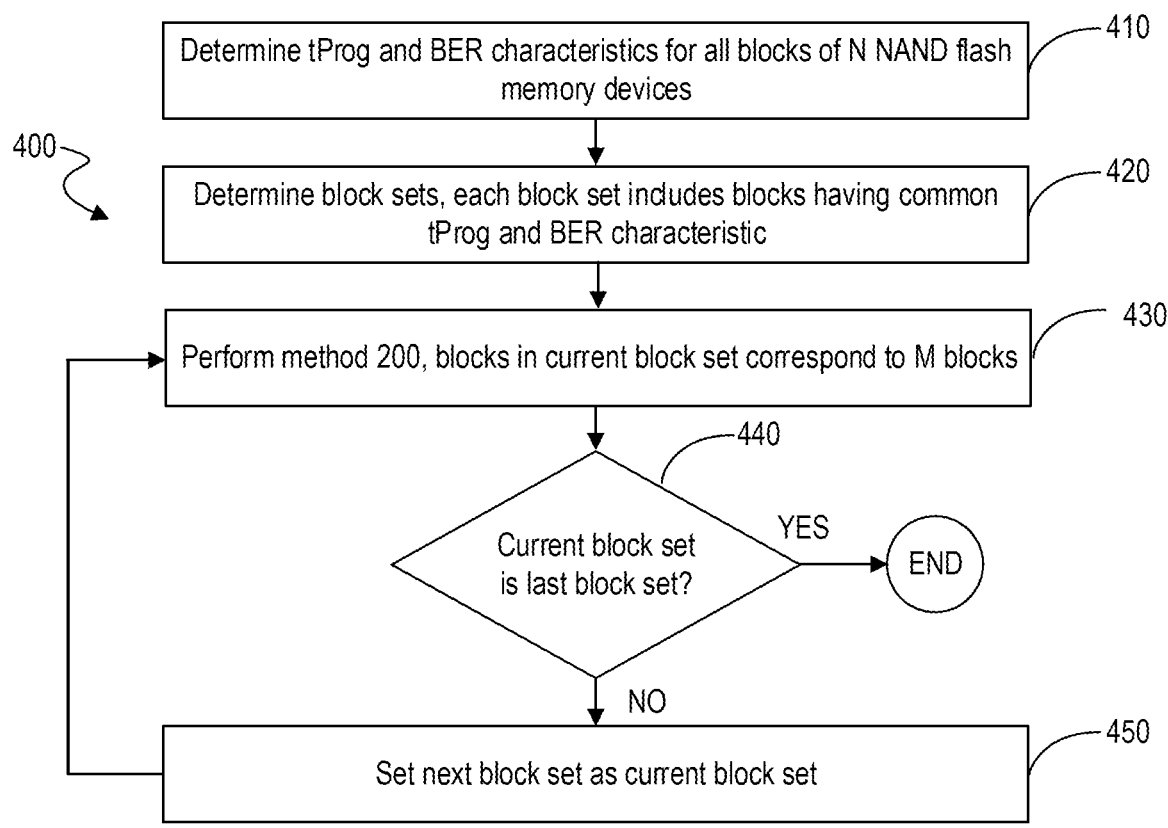
FIG. 4 is a flowchart illustrating an example training method, according to some arrangements.

FIG. 4 is a flowchart illustrating an example training method 400, according to some arrangements. Referring to FIGS. 1-4, the training method 400 allows the test circuit 102 to generate a parameter table and incorporates the method 200. In the method 400, all blocks of the N NAND flash memory devices are divided into multiple block sets, each block set includes a plurality of blocks. Each block set includes blocks having similar tProg and BER distributions, while blocks from different block sets have more distinct tProg and BER distributions. In that regard, programming parameters for blocks within the same block set are more similar in value than programming parameters for blocks in different block sets. The method 200 is executed for each block set, such that the plurality of blocks in each block set corresponds to the M blocks in the method 200.

At 410, the test circuit 102 determines tProg and BER characteristics for all blocks of the N NAND flash memory devices. For example, the controller 110 programs all rows and WLs of all blocks of all of the N NAND flash memory devices with random reference data using the default programming parameters. Examples of the default programming parameters include but are not limited to, default $V_{start}$, default $V_{step}$, default $V_{bias}$, default NPP, and other default parameters used in the ISPP, and so on. Then, the random reference data is read using default voltage thresholds. Based on the programming and reading, the tProg and BER characteristics for each of all blocks of the N NAND flash memory devices are determined. For example, the tProg and the BER for each of all blocks of the N NAND flash memory devices are measured based on the programming and reading.

At 420, the test circuit 102 determines block sets, each block set includes blocks having common tProg and BER characteristics. For example, the test circuit 102 divides all blocks of all of the N NAND flash memory devices into multiple different block sets or groups. The number of the block sets is referred to as Sb.

In some examples, all blocks are ranked according to their tProg and divided into Sb block sets according to different tProg ranges, such that a first block set includes blocks having tProg within the lowest tProg range, a second block set includes blocks having tProg within a second lowest tProg range (and higher than the lowest tProg range), a third block set includes blocks having tProg within a third lowest tProg range (and higher than the lowest and the second lowest tProg range), . . . , and the $Sb^{th}$ block set includes blocks having tProg within the highest tProg range.

In some examples, all blocks are ranked according to their BER and divided into Sb block sets according to different BER ranges, such that a first block set includes blocks having BER within the lowest BER range, a second block set includes blocks having BER within a second lowest BER range (and higher than the lowest BER range), a third block set includes blocks having BER within a third lowest BER range (and higher than the lowest and the second lowest BER range), . . . , and the $Sb^{th}$ block set includes blocks having tProg within the highest BER range.

In some examples, a score is computer for each block of all blocks of the N NAND flash memory devices based on a combination of BER per block and tProg per block. For example, the score can be a weighted sum of BER per block and tProg per block, or the result of another suitable function with BER per block and tProg per block as inputs. All blocks are ranked according to their scores and divided into Sb block sets according to different scores ranges, such that a first block set includes blocks having scores within the lowest scores range, a second block set includes blocks having scores within a second lowest scores range (and higher than the lowest scores range), a third block set includes blocks having scores within a third lowest scores range (and higher than the lowest and the second lowest scores range), . . . , and the $Sb^{th}$ block set includes blocks having tProg within the highest scores range.

For each block set of the Sb block sets, 430-450 are performed. For example, at 430, the test circuit 102 performs the method 200 for a current block set, with the blocks in the current block set being the M blocks of the method 200. The method 200 ends at 260:NO, where tuned programming parameters as a function of WL is generated (e.g., as a table). At 440, the test circuit 102 determines whether the current block set is the last block set. In response to determining that the current block set is the last block set (440:YES), the method 400 ends, and the tuned programming parameters for each block set of the Sb block sets have been generated. On the other hand, in response to determining that the current block set is not the last block set (440:YES), at 450, a next block set is set as the current block set, and the method 400 returns to 430.

Dividing the blocks into different block sets allows a more accurate characterization of programming parameters to be determined more efficiently for all N NAND flash memory devices. Alternative to tProg and BER characteristics of each block as described herein, block sets can also be generated based on physical locations within dies of the NAND flash memory devices that are correlated to BER and tProg distribution.

Figure 5:
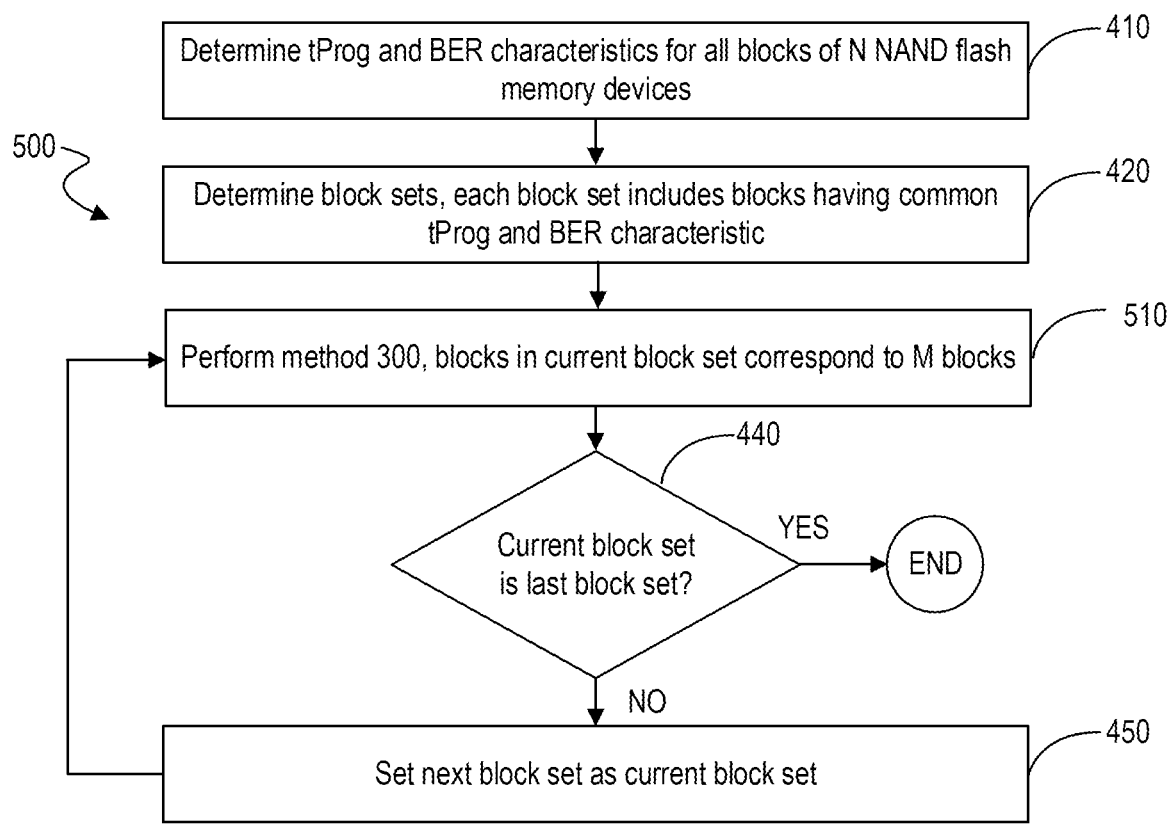
FIG. 5 is a flowchart illustrating an example training method, according to some arrangements.

FIG. 5 is a flowchart illustrating an example training method 500, according to some arrangements. Referring to FIGS. 1-5, the training method 500 allows the test circuit 102 to generate a parameter table and incorporates the method 300. In the method 500, all blocks of the N NAND flash memory devices are divided into multiple block sets, as described with respect to FIG. 4. The method 300 is executed for each block set, such that the plurality of blocks in each block set corresponds to the M blocks in the method 300.

At 410, the test circuit 102 determines tProg and BER characteristics for all blocks of the N NAND flash memory devices as described with respect to FIG. 4. At 420, the test circuit 102 determines block sets, each block set includes blocks having common tProg and BER characteristics as described with respect to FIG. 4.

For each block set of the Sb block sets, 510, 440, and 450 are performed. For example, at 510, the test circuit 102 performs the method 300 for a current block set, with the blocks in the current block set being the M blocks of the method 300. The method 300 ends at 320:NO, where tuned programming parameters as a function of WL is generated (e.g., as a table). At 440, the test circuit 102 determines whether the current block set is the last block set. In response to determining that the current block set is the last block set (440:YES), the method 500 ends, and the tuned programming parameters for each block set of the Sb block sets have been generated. On the other hand, in response to determining that the current block set is not the last block set (440:YES), at 450, a next block set is set as the current block set, and the method 500 returns to 510.

In some implementations, voltage thresholds for read operations can be acquired (instead of using default voltage read threshold) for minimization of NAND read errors. In that regard, a threshold tracking estimator that is aware of physical parameters (e.g. rows, word-lines, block addresses, P/E cycle counts, and so on) can be used for program DSP. Accordingly, the methods for determining programming parameters for WLs or row as described herein can be combined with a threshold tracking estimator. In some examples, read DSP with a threshold tracking algorithm for each row-set can be trained separately from the methods described herein, thus improving accuracy of threshold estimation.

In other examples, read DSP with a threshold tracking algorithm for each row-set can be trained jointly with program DSP selection of row-sets or other parameters. That is, for every iteration in which determines programming parameters are updated for a given WL, the read DSP estimation accuracy is also computed using the updated programming parameters in that iteration.

Figures 6, 7:
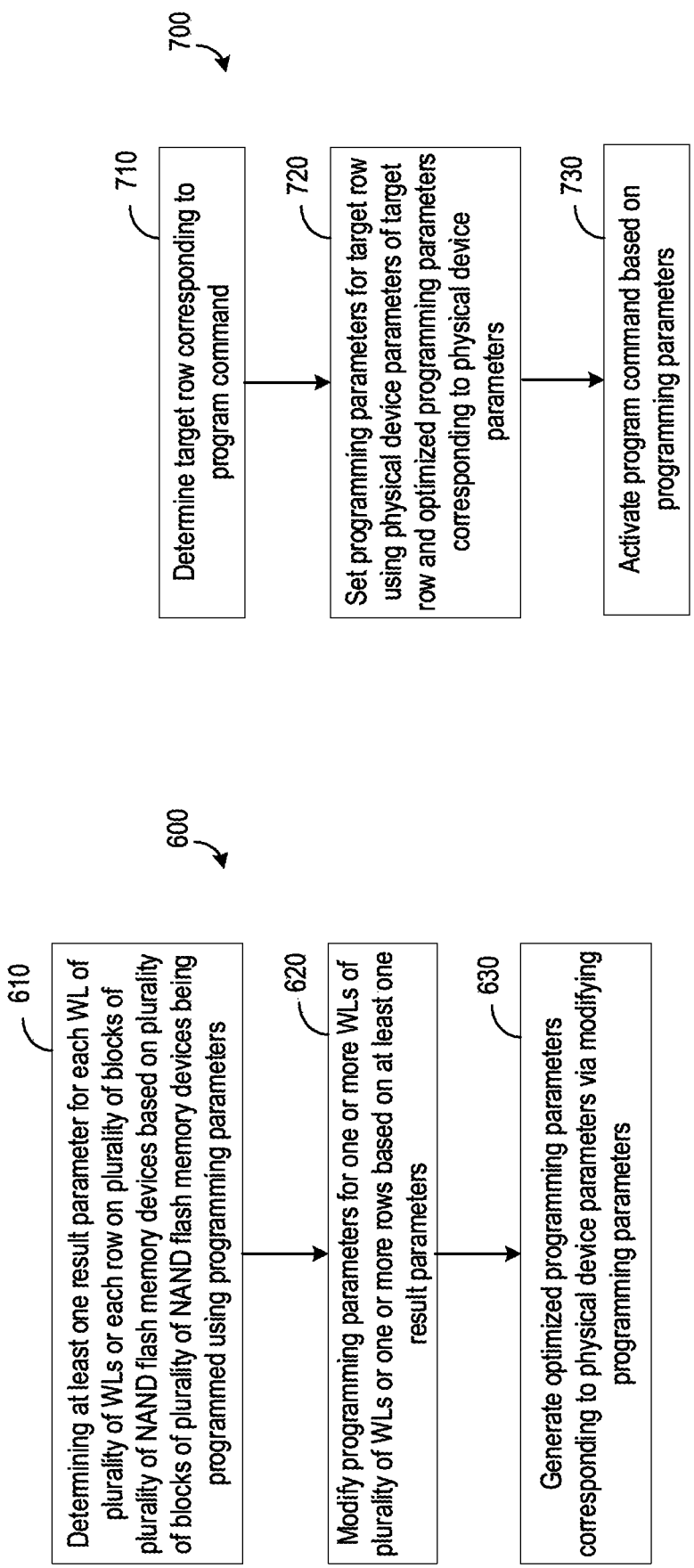
FIG. 6 is a flowchart illustrating an example training method, according to some arrangements.
FIG. 7 is a process flow diagram illustrating an example method for programming data using trained programming parameters, according to some arrangements.

FIG. 6 is a flowchart illustrating an example training method 600, according to some arrangements. Referring to FIGS. 1-6, the methods 200, 300, 400, and 500 are particular implementations of the method 600. The method 600 can be performed by the test circuit 102 to generate optimized programming parameters for each WL or each row of multiple NAND flash memory devices (e.g., the N NAND flash memory devices). Each WL includes a set of physical rows in a same physical layer of one of the plurality of NAND flash memory devices in some examples. In other examples, each WL refers merely a group of rows.

At 610, the test circuit 102 determines at least one result parameter for each row or for each WL of plurality of WLs on a plurality of blocks of a plurality of NAND flash memory devices based on the plurality of blocks of the plurality of NAND flash memory devices being programmed using programming parameters. The at least one result parameter includes a STD of page BER for each WL or for each row. The STD of the page BER for each WL or row is determined using a moment of BER distribution for each WL or row. In some examples, the moment can be greater than 2. The at least one result parameter includes an average BER for each WL or each row. The at least one result parameter includes a maximum BER for each WL or each row. The at least one result parameter includes a score for each WL or each row, the score being determined using a plurality of moments of page BER distribution for each WL or each row.

At 620, the test circuit 102 modifies the programming parameters for one or more WLs of the plurality of WLs or for one or more rows based on the at least one result parameter. In some examples, the programming parameters include at least one of $V_{start}$, $V_{step}$, $V_{bias}$, or NPP. In some examples, modify the programming parameters for the one or more WLs of the plurality of WLs or for one or more rows based on the at least one result parameter includes determining that one of the at least one result parameter for each of the one or more WLs or for each of the one or more rows crosses a threshold, and in response, modifying the programming parameters for each of the one or more WLs or one or more rows.

The method 600 further includes, in some examples, determining the at least one result parameter for each WL of the plurality of WLs or for each row on the plurality of blocks of the plurality of NAND flash memory devices based on the plurality of blocks of the plurality of NAND flash memory devices being programmed using the modified programming parameters. The method 600 further includes, in some examples, determining that one of the at least one result parameter for any of the plurality of WLs or any of the rows does not cross a threshold, and in response, determining that the programming parameters for each of the plurality of WLs or for each row are optimized programming parameters. In some examples, modifying the programming parameters for each of the one or more WLs or for each of the one or more rows includes adjusting tProg for each of the one or more WLs or for each of the one or more rows by modifying the programming parameters for each of the one or more WLs or for each of the one or more rows.

At 630, the test circuit 102 generates optimized programming parameters corresponding to physical device parameters via modifying the programming parameters for the one or more WLs of the plurality of WLs or for the one or more rows based on the at least one result parameter. The physical device parameters include at least an address of each of the plurality of WLs or an address of each row of the one or more rows.

In some examples, the method 600 further includes preconditioning the plurality of blocks to different cycle counts. The at least one result parameter is determined after the plurality of blocks are preconditioned.

In some examples, a number of the plurality of blocks is less than a total number of blocks on the plurality of NAND flash memory devices. The plurality of blocks can be selected randomly from all blocks on the plurality of NAND flash memory devices in some examples. In some examples, all blocks on the plurality of NAND flash memory devices are divided into a plurality of block sets based on one or more of programming time or error characteristics, such that blocks within each of the plurality of block sets correspond to the plurality of blocks referenced at 610.

Accordingly, the methods described herein relate to a training process for obtaining adaptive trim parameters (optimized programming parameters) for distinct row-sets. The training process includes testing multiple NAND flash memory devices under different endurance and stress conditions (e.g., different cycle counts) to: define row-sets (WLs) from tProg and BER per page measurements on multiple devices; compute measurement score for each row-set indicating possible parameters modification; update program DSP trim parameters per row-set; and repeat the above process until performance target is met and similar scores are obtained over all row sets.

In some examples, the score for optimization is STD of page BER as function of WL measured on the multiple NAND flash memory devices. In some examples, score optimization can be performed using any higher order moment of the page BER distribution as function of physical device parameters (e.g., row, WL, so on) of the NAND flash memory devices.

As described, the methods described herein reduce the BER standard deviation per row or WL to achieve reliability and allow operation in high average BER while controlling a low peak-to-average BER distribution. High write performance can be achieved with improvement of reliability for same stress conditions.

The methods include optimizing programming parameters as function of other physical device parameters such as block address, P/E cycle count, and so on. This means that the methods described herein can be implemented for sets of blocks which have common physical device characteristics, and programming parameter sets can be obtained for each set of blocks with different row-sets. In addition, the methods described herein can be applied on different cycle ranges separately.

FIG. 7 is a process flow diagram illustrating an example method 700 for programming data using trained programming parameters, according to some arrangements. Referring to FIGS. 1-7, the method 700 is performed by the controller 110. As described, after the test circuit 102 determines the optimized programming parameters using one or more of the methods 200, 300, 400, 500, or 600, the test circuit 102 can transfer the programming parameters as a function of WL or row (e.g., in the form of a table) to the controller memory 112 using any suitable mechanism. The controller 110 can use such programming parameters to program data. The method 700 is simple and introduced insignificant overhead in terms of tuning per NAND flash memory device.

At 710, the controller 110 determines a target row corresponding to a program command. The controller 110 can receive a program command from the host 101 and translates (via the FTL) a logical address corresponding to the command into a physical address including a row address/ID/number and a block address/ID/number.

At 720, the controller 110 sets programming parameters for the target row using physical device parameters of the target row and optimized programing parameters corresponding to the physical device parameters. For example, the controller 110 looks up the physical device parameters (e.g., the row address/ID/number, the block address/ID/number, and if available, the cycle count) in the parameter table stored in the controller memory 112 and determines a set of optimized programming parameters (e.g., $V_{start}$, $V_{step}$, $V_{bias}$, NPP, and other parameters used in the ISPP or other program trim parameters) mapped to the physical device parameters.

At 730, the controller 110 activates the program command. In response to the programming parameters being set for the row/block identified by the row address/ID/number and the block address/ID/number, the controller 110 activates the program command and programs data corresponding to the program command on the row/block identified by the row address/ID/number and the block address/ID/number.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method, comprising:
   determining at least a target row and a target block corresponding to a program command;
   setting row-based programming parameters for the target row and the target block using target physical device parameters for the target row and the target block and optimized programming parameters corresponding to the target physical device parameters; and
   activating, in response to the program command, a programming operation of data for the target row and the target block of the program command by setting trim parameters of a program DSP with the row-based programming parameters, wherein for a first target row and target block, the trim parameters of the program DSP for programming the data are set with a first set of row-based programming parameters, and wherein for a second different target row and target block, the trim parameters of the program DSP for programming the data are set with a second set of row-based programming parameters that is different from the first set of row-based programming parameters.

2. The method of claim 1, further comprising:
   determining at least one result parameter for each row of a plurality of rows of blocks of a plurality of NAND flash memory devices based on the plurality of blocks of the plurality of NAND flash memory devices being programmed using programming parameters; and
   modifying the programming parameters for one or more rows of the plurality of rows based on the at least one result parameter.

3. The method of claim 2, further comprising generating the optimized programming parameters mapped to physical device parameters via modifying the programming parameters for the one or more rows of the plurality of rows based on the at least one result parameter.

4. The method of claim 2, wherein the programming parameters comprise at least one of an initial voltage level of a programmed cell $V_{start}$, a pulse voltage step $V_{step}$, a bias voltage $V_{bias}$, a maximum Number of Pulses (NPP), a programming voltage pulse width, a pulse shape, a pulse rise time, a pulse fall time, or an inter-pulse delay time.

5. The method of claim 2, wherein the at least one result parameter comprises a standard deviation of page Bit Error Rate (BER) for each row.

6. The method of claim 5, wherein the standard deviation of the page BER for each row is determined using a moment of BER distribution for each row, the moment being greater than 2.

7. The method of claim 2, wherein the at least one result parameter comprises an average Bit Error Rate (BER) for each row.

8. The method of claim 2, wherein the at least one result parameter comprises a maximum Bit Error Rate (BER) for each row.

9. The method of claim 2, wherein the at least one result parameter comprises a score for each row, the score being determined using a plurality of moments of page Bit Error Rate (BER) distribution for each row.

10. The method of claim 2, wherein modifying the programming parameters for the one or more rows of the plurality of rows based on the at least one result parameter comprises:
   determining that one of the at least one result parameter for each of the one or more rows crosses a threshold; and
   in response, modifying the programming parameters for each of the one or more rows.

11. The method of claim 10, further comprising determining the at least one result parameter for each row of the plurality of rows on the plurality of blocks of the plurality of NAND flash memory devices based on the plurality of blocks of the plurality of NAND flash memory devices being programmed using the modified programming parameters.

12. The method of claim 10, further comprises:
   determining that one of the at least one result parameter for any of the plurality of rows does not cross a threshold; and
   in response, determining that the programming parameters for each of the plurality of rows are optimized programming parameters.

13. The method of claim 10, wherein modifying the programming parameters for each of the one or more rows comprises adjusting a program time tProg for each of the one or more rows by modifying the programming parameters for each of the one or more rows.

14. The method of claim 2, further comprising preconditioning the plurality of blocks to different cycle counts, wherein the at least one result parameter is determined after the plurality of blocks are preconditioned.

15. The method of claim 2, wherein a number of the plurality of blocks is less than a total number of blocks on the plurality of NAND flash memory devices.

16. The method of claim 15, wherein the plurality of blocks is selected randomly from all blocks on the plurality of NAND flash memory devices.

17. The method of claim 15, wherein all blocks on the plurality of NAND flash memory devices are divided into a plurality of block sets based on one or more of programming time or error characteristics, and blocks within each of the plurality of block sets correspond to the plurality of blocks.

18. The method of claim 1, wherein setting row-based programming parameters for the target row and the target block includes:
   identifying the target physical device parameters for the target row and the target block;
   obtaining the optimized programming parameters corresponding to the identified target physical device parameters from a parameter table.

19. A storage device, comprising:
   non-volatile memory; and
   a controller configured to:
      determine at least a target row and a target block corresponding to a program command;
      set row-based programming parameters for the target row using target physical device parameters for the target row and the target block and optimized programming parameters corresponding to the target physical device parameters; and
      activate, in response to the program command, a programming operation of data for the target row and the target block of the program command by setting trim parameters of a program DSP with the row-based programming parameters, wherein for a first target row and target block, the trim parameters of the program DSP for programming the data are set with a first set of row-based programming parameters, and wherein for a second different target row and target block, the trim parameters of the program DSP for programming the data are set with a second set of row-based programming parameters that is different from the first set of row-based programming parameters.

20. Non-transitory processor-readable media comprising processor-readable instructions such that, when executed by a processor, causes the processor to:
   determine at least a target row and a target block corresponding to a program command;
   set row-based programming parameters for the target row using target physical device parameters for the target row and the target block and optimized programming parameters corresponding to the target physical device parameters; and
   activate, in response to the program command, a programming operation of data for the target row and the target block of the program command by setting trim parameters of a program DSP with the row-based programming parameters, wherein for a first target row and target block, the trim parameters of the program DSP for programming the data are set with a first set of row-based programming parameters, and wherein for a second different target row and target block, the trim parameters of the program DSP for programming the data are set with a second set of row-based programming parameters that is different from the first set of row-based programming parameters.

* * * * *